(12) United States Patent
Pakbaz et al.

(10) Patent No.: US 7,603,639 B2
(45) Date of Patent: Oct. 13, 2009

(54) METHOD, APPARATUS AND COMPUTER PROGRAM PRODUCT FOR CONTROLLING JITTER OR THE EFFECTS OF JITTER IN INTEGRATED CIRCUITRY

(75) Inventors: Faraydon Pakbaz, Milton, VT (US); Stephen Dale Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 11/695,627

(22) Filed: Apr. 3, 2007

(65) Prior Publication Data

US 2008/0250367 A1   Oct. 9, 2008

(51) Int. Cl.
*G06F 17/50* (2006.01)
*G06F 9/45* (2006.01)

(52) U.S. Cl. ............... 716/5; 716/1; 716/6; 716/18; 703/13; 703/14

(58) Field of Classification Search ............... 716/1–6, 716/18; 703/13–22
See application file for complete search history.

(56) References Cited

U.S. PATENT DOCUMENTS

| | | | |
|---|---|---|---|
| 6,671,863 B2 | 12/2003 | Gauthier et al. | |
| 6,789,237 B1 * | 9/2004 | Ismail | 716/4 |
| 6,819,192 B2 | 11/2004 | Gauthier et al. | |
| 7,005,907 B2 * | 2/2006 | Ibuka | 327/295 |
| 2006/0036980 A1 * | 2/2006 | Kobayashi | 716/4 |

OTHER PUBLICATIONS

Heydari et al., Analysis of Jitter due to Power Supply Noise in Phase-Locked Loop, 2000, IEEE, pp. 443-446.*
Larsson, Patrik, Measurements and Analysis of PLL Jitter Caused by Digital Switching Noise, IEEE Journal of Solid-State Circuits, vol. 36, No. 7, Jul. 2001, pp. 1113-1119.
Voorakaranam, R., Chatterjee, A., Low-Cost Jitter Measurement Technique for Phase-Locked Loops, Proceedings of the 43rd IEEE Midwest Symposium on Circuits and Systems, Meeting Date: Aug. 8, 2000-Aug. 11, 2000, vol. 2, pp. 960-965.

* cited by examiner

*Primary Examiner*—Thuan Do
*Assistant Examiner*—Nghia M Doan
(74) *Attorney, Agent, or Firm*—Riyon Harding; Anthony V. S. England; Michael J. LeStrange

(57) ABSTRACT

Designing integrated circuitry ("IC") includes simulating noise of modeled IC operation and applying the noise to buffers of a clock tree of the modeled IC, responsively generating a first simulated clock tree output signal. Components of the first simulated clock tree output signal are scaled in a frequency domain responsive to their time domain variations at respective frequencies. A simulated, substantially noise-only, clock tree output signal is generated in a frequency domain, wherein some components are removed responsive to at least one clock signal frequency and scaled magnitudes of the components. A second simulated clock circuitry output signal is generated responsive to a transfer function of certain clock circuitry. A circuit structure or fabricating process is selected responsive to jitter of the second simulated clock circuitry output signal. The IC may be fabricated using the selected process and may include the selected structure.

20 Claims, 7 Drawing Sheets

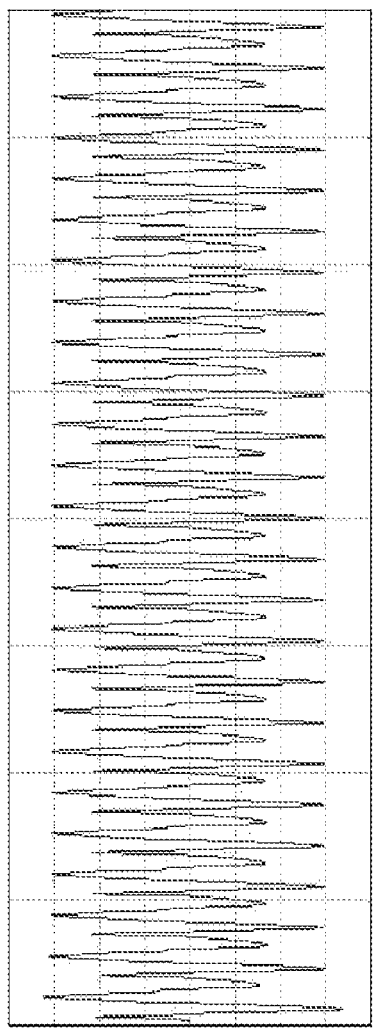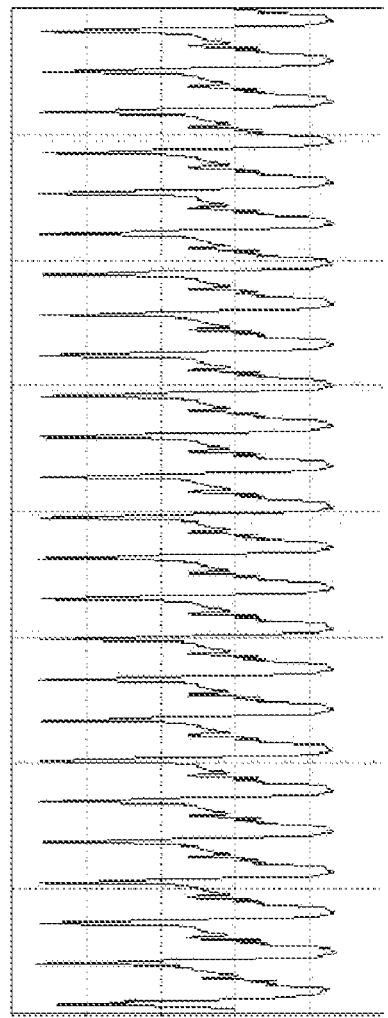
FIG. 2

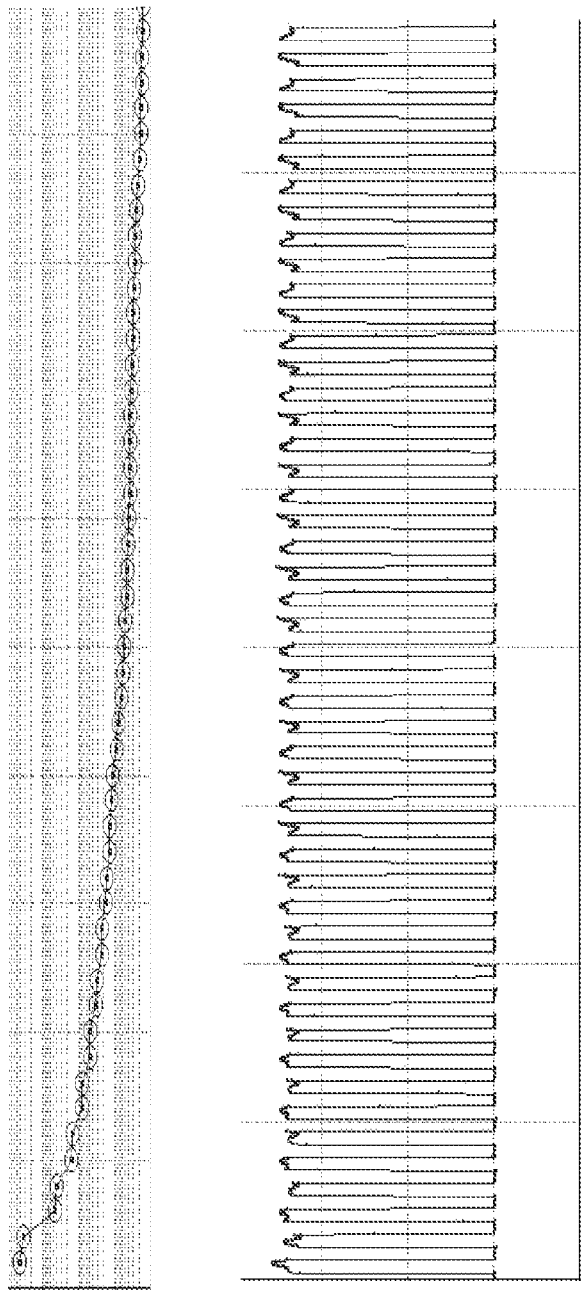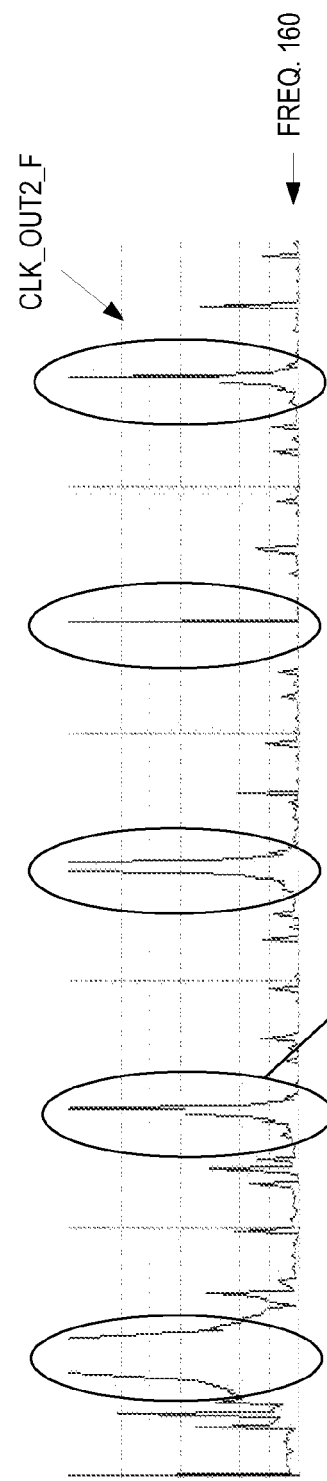
FIG. 6

METHOD, APPARATUS AND COMPUTER PROGRAM PRODUCT FOR CONTROLLING JITTER OR THE EFFECTS OF JITTER IN INTEGRATED CIRCUITRY

BACKGROUND

1. Field of the Invention

The present invention concerns determining an expected amount of clock signal jitter on a clock distribution network, and may include selecting particular combinations of characteristics for circuitry of a device such that jitter is reduced

2. Related Art

FIG. 1A illustrates a power supply 101 connected to integrated circuitry device 100 having a clock 144 and clock distribution network 142, according to the prior art. Coordinated timing of the operation of circuitry 145 throughout device 100 depends on clock signals distributed to circuitry 145 by network 142. Jitter introduces uncertainty in the timing of those clock signals. If jitter is too large or circuitry 145 is not adequately tolerant of the jitter, circuitry 145 throughout device 100 will not operate in proper coordination, thus resulting in malfunctions, which may include erroneous calculations, deadlock, or the like.

SUMMARY OF THE INVENTION

The present invention addresses the above described problem. In one form of the invention, a method for designing integrated circuitry ("IC") includes simulating noise of modeled IC operation, wherein the simulating excludes certain clock circuitry of the IC. The simulated noise is applied to buffers of a clock tree of the modeled IC and a first simulated clock tree output signal is responsively generated. Components of the first simulated clock tree output signal are scaled in a frequency domain responsive to time domain variations of the components at respective frequencies. A simulated, substantially noise-only, clock tree output signal is generated in a frequency domain, which includes removing ones of the components responsive to i) at least one clock signal frequency of the certain clock circuitry and ii) magnitudes of the time variation scaled components. A second simulated clock circuitry output signal is generated responsive to applying a closed loop transfer function of the certain clock circuitry to a simulated reference clock signal and the substantially noise-only clock tree output signal. A circuit structure or a fabricating process for the IC is selected responsive to jitter of the transformed second simulated clock circuitry output signal.

In another aspect, the method includes transforming the second simulated clock circuitry output signal to a time domain signal by an inverse Laplace transformation.

In another aspect, the scaling includes Eigenvalue decomposition of the first simulated clock tree output signal.

In another aspect, removing components from the converted clock tree output signal includes removing the components responsive to a fundamental frequency and odd harmonic frequencies of the clock signal.

In another aspect, applying the simulated noise to the buffers includes applying the simulated noise to voltage supply and ground connections of the buffers.

In another aspect, generating a first simulated clock tree output signal includes generating the first simulated clock tree output signal at a certain output node of the clock tree, wherein the clock tree has a number of sets of buffers connected in series, at least one of the sets has a maximum number of such series-connected buffers, and one of the series-connected sets of buffers is from an input node receiving the reference clock signal to the certain clock tree output node and is among the at least one of the sets having a maximum number of such series-connected buffers.

In another aspect, the simulating that excludes certain clock circuitry of the modeled IC excludes phased locked loop ("PLL") circuitry.

In another aspect, the method includes feeding the first simulated clock tree output signal back to a node of the certain clock circuitry.

In another aspect, the feeding the first simulated clock tree output signal back includes feeding the first simulated clock tree output signal back to a node of the PLL circuitry.

In another form of the invention, a computer program product for designing integrated circuitry ("IC"), is stored on a tangible, computer readable medium. The computer program 1 product has instructions for execution by a computer, which, when executed by the computer, cause the computer to implement a method, such as the above described method.

In another form of the invention, a computer system includes a processor and a storage device connected to the processor, wherein the storage device has stored thereon an integrated circuitry ("IC") design program for controlling the processor. The processor is operative with the program to execute the program for performing a method, such as the above described method.

Other variations, objects, advantages, and forms of the invention will become apparent upon reading the following detailed description and upon reference to the accompanying drawings.

DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment read in conjunction with the accompanying drawings.

FIG. 2 illustrates noise simulated by process 103 as applied to VDD and GND of the clock distribution network shown in FIG. 1A, according to an embodiment of the present invention.

FIG. 6 illustrates a simulated CLK_OUT_2F signal arising from feeding back the simulated feedback clock signal CLK_OUT_2T shown in FIG. 4 to the PLL.

DETAILED DESCRIPTION OF A PREFERRED EMBODIMENT OF THE INVENTION

In the following detailed description of the preferred embodiments, reference is made to the accompanying drawings illustrating embodiments in which the invention may be practiced. It should be understood that other embodiments may be utilized and changes may be made without departing from the scope of the present invention. The drawings and detailed description are not intended to limit the invention to the particular form disclosed. On the contrary, the intention is to cover all modifications, equivalents and alternatives falling within the spirit and scope of the present invention as defined by the appended claims. Headings herein are not intended to limit the subject matter in any way.

Overview of Processes Concerning Clock Signal Jitter

Figure 1:
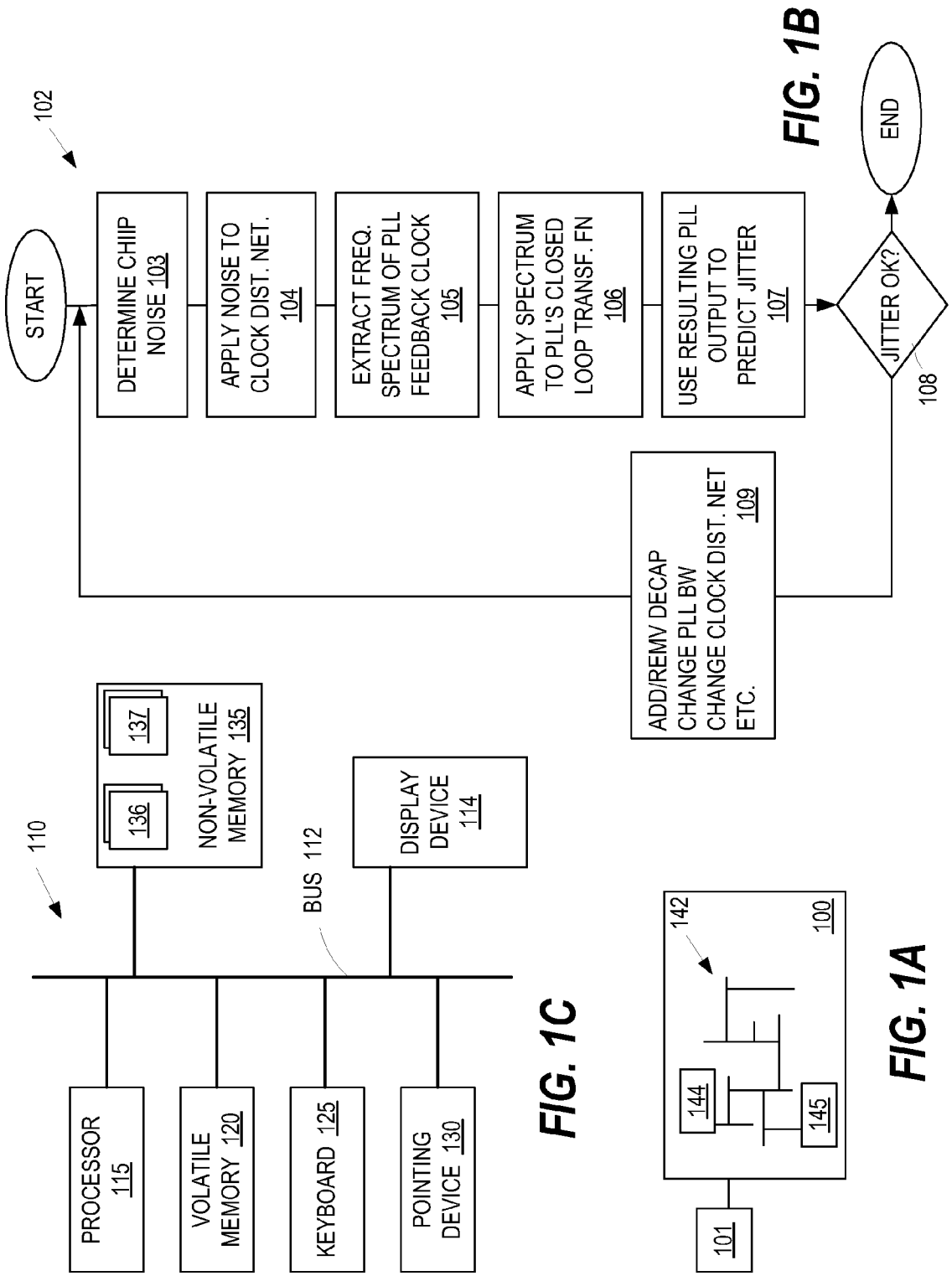
FIG. 1A illustrates a power supply connected to an integrated circuitry device having a clock distribution network, according to the prior art.
FIG. 1B illustrates processes for determining an expected amount of clock signal jitter on the clock distribution network and for selecting particular combinations of characteristics for the circuitry of the device or power supply of FIG. 1A, where the particular characteristics are selected such that jitter is reduced, according to an embodiment of the present invention.
FIG. 1C illustrates a computer system having instructions to implement a method in accordance with the present invention, wherein memory of the system has data stored thereon that provides circuit models for the power supply and integrated circuitry device of FIG. 1A, including the clock and clock distribution network thereof.

FIG. 1B illustrates processes 102 for determining an expected amount of clock signal jitter on the clock distribution network 142, which depends upon numerous factors, as will be described herein below. By enabling the determination of expected jitter on network 142, processes 102 enable the control of PLL generated jitter or its effects. That is, processes 102 enable assured operation of device 100 within specifications, despite the clock signal timing uncertainty caused by jitter. Processes 102 enable this by quantitatively predicting the amount of jitter, which permits design of circuitry 145 on device 100 such that circuitry 145 tolerates the amount of associated clock signal timing uncertainty. Processes 102 also enable determining the effect on jitter that is caused by a change to the clock distribution network 142 or other circuitry of device 100 or to power supply 101. This, in turn, enables the selection of particular combinations of characteristics for the circuitry 145 of device 100 or power supply 101, where the particular characteristics are selected such that jitter is reduced. Overall, the application of processes 102 avoid a situation where on-chip noise would otherwise cause a PLL's output jitter to be higher than its specification, such as due to loop peaking.

Computer Programs and System

Processes 102 of the present invention, aspects of which are shown in FIG. 1B, are capable of being distributed in the form of instructions. This may include instructions stored on a tangible, computer readable storage medium. The present invention applies equally regardless of the particular type of signal bearing media actually used to carry out the distribution. Examples of tangible, computer readable storage media include recordable-type media such as a floppy disc, a hard disk drive, a RAM, and CD-ROM's. The instructions may also be distributed by digital and analog communications links, which are sometimes referred to as "transmission media."

Referring now to FIG. 1C, a computer system 110 is illustrated, which may take a variety of forms, including a personal computer system, mainframe computer system, workstation, server, etc. That is, it should be understood that the term "computer system" is intended to encompass any device having a processor that executes instructions from a memory medium. In the illustrated system embodiment, system 110 includes one or more processors 115, a keyboard 125, a pointing device 130, and tangible, computer-readable storage media, including volatile 120, and nonvolatile memory 135, e.g., ROM, hard disk, floppy disk, CD-ROM, and DVD, and display device 114.

Memory 135 of system 110 stores computer programs 136 (also known as "software programs"), wherein programs 136 include instructions that are executable by one or more processors 115 to implement various embodiments of a method in accordance with the present invention. Memory 135 of system 110 also has data 137 stored thereon that provides circuit models for power supply 101 and integrated circuitry device 100 of FIG. 1A, including clock and clock distribution network 142. Programs 136 include instructions for implementing the processes 102 of FIG. 1B, for example. This includes simulating circuit behavior of device 100 and power supply 101 responsive to model data 137.

Those of ordinary skill in the art will appreciate that the hardware in FIG. 1C may vary depending on the implementation. For example, other peripheral devices may be used in addition to or in place of the hardware depicted in FIG. 1C. The depicted example is not meant to imply architectural limitations with respect to the present invention. Various embodiments of system 110 implement one or more software programs 136 and data 137 in various ways, including procedure-based techniques, component-based techniques, and/or object-oriented techniques, among others. Specific examples include XML, C, C++ objects, Java and commercial class libraries.

Details of Simulation Regarding Clock Signal Jitter

Figure 3:
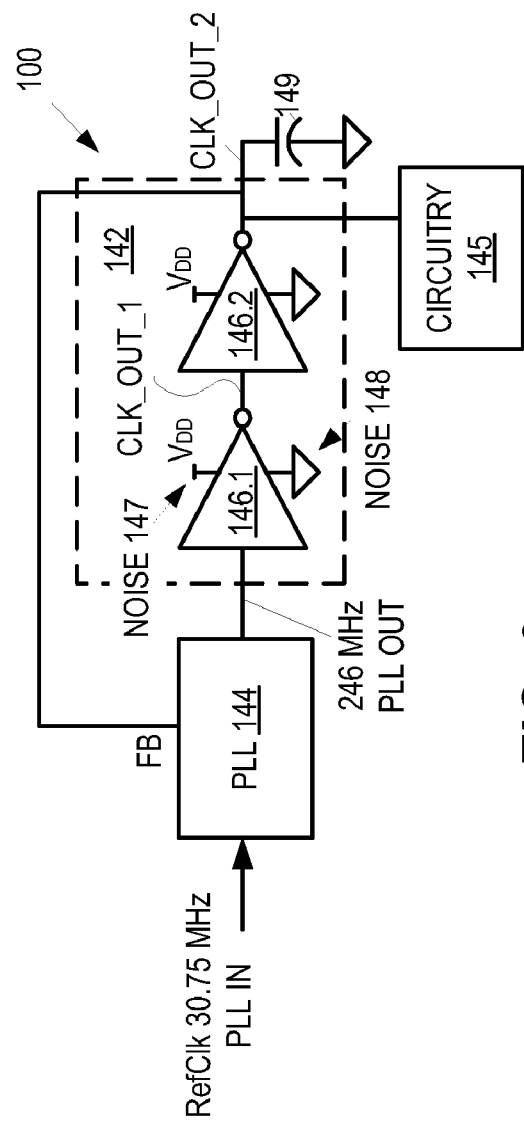
FIG. 3 is a schematic illustrating details of some aspects of the integrated circuitry device of FIG. 1A, and shows locations of simulated noise inputs to the device's clock distribution network, according to an embodiment of the present invention.

Referring now to FIG. 3, device 100 of FIG. 1A is shown with details relating to simulation of clock signal jitter, according to an embodiment of the present invention. PLL 144 of device 100 receives an external clock signal RefClk and responsively produces a higher frequency on-chip clock signal at PLL OUT to drive clock tree 142. One output leaf of the clock tree is used as a feedback input FB to the PLL.

Clock tree 142 in the illustrated embodiment of device 100 is physically constructed in a digital power domain, which means clock tree 142 is exposed to on-chip switching noise induced by SRAM, CAM, I/O, and other circuits. This noise on digital power planes VDD and GND introduces jitter in clock tree 142 that becomes greater in magnitude as the clock tree delay increases. That is, jitter tends to increase for clock signals that have traveled further from the PLL or though more buffers of the clock tree. The output leaf that is fed back to PLL 144 is selected to be a leaf, i.e., node, having the maximum number of buffers or distance from the PLL and thus represents a clock with the maximum amount of VDD- GND induced jitter. That is, clock tree 142 has numerous sets of series-connected buffers. At least one of the sets has the largest number of such buffers connected in series. In an embodiment of the invention, the series-connected sets of buffers from an input node receiving the RefClk signal to the output node that is fed back to PLL 144 is at least among the sets having the largest number of such series-connected buffers.

The number of buffers or distance from the PLL will vary based on application. The present invention applies regardless of number of buffers or distance from the PLL. In a preferred embodiment of the invention, the output leaf that is fed back to PLL 144 is selected to be a leaf having the maximum benefit to device 100 timing.

Figure 5:
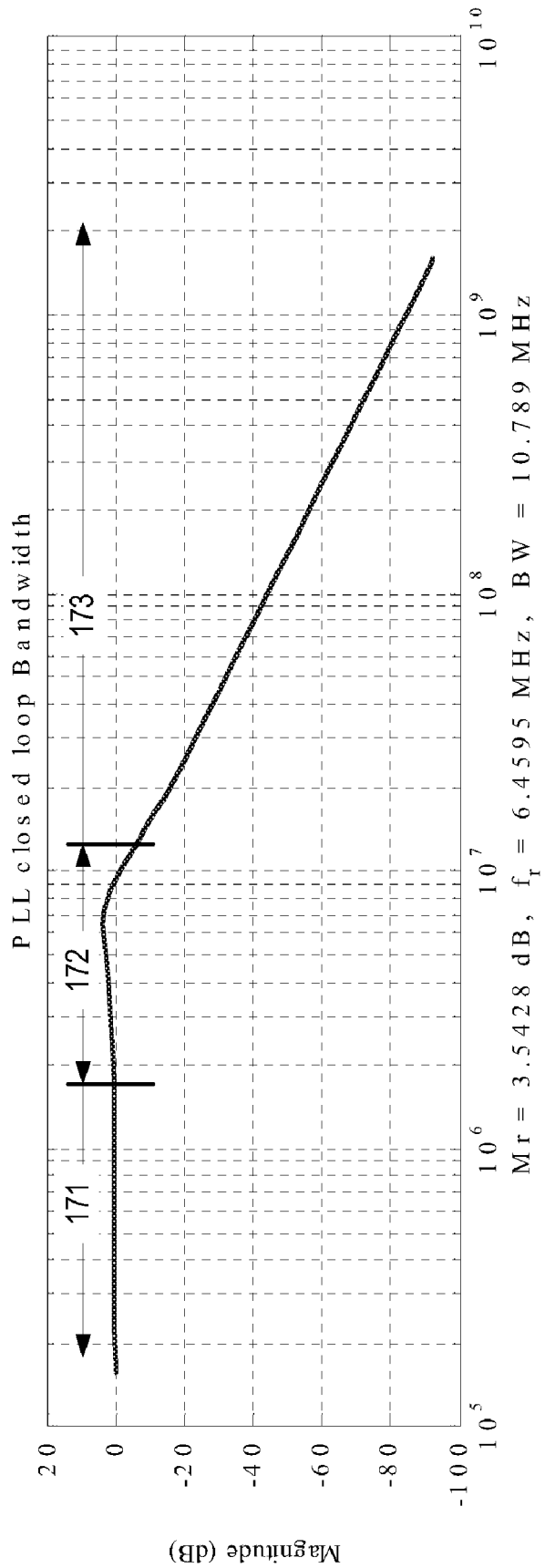
FIG. 5 illustrates a noise rejection curve for a closed-loop transfer function of a PLL such as that of FIG. 1A, according to an embodiment of the present invention.

The magnitude and frequency content of the jitter at feedback input FB of PLL 144 influences the amount of jitter at PLL OUT. That is, PLL 144 processes jitter at its feedback input responsive to the closed-loop transfer function of PLL 144. Referring now to FIG. 5, the closed-loop transfer function of PLL 144 is illustrated as a noise rejection curve having unity gain region (0 dB) 171 from 0 Hz to a frequency below the natural frequency where the input jitter is passed directly to the output, amplification region 172 in which the input jitter is amplified and sent to the output, and attenuation region 173 in which the input jitter is attenuated. Attenuation region 173 includes a bandwidth cutoff point (−3 dB).) An important goal is to avoid jitter frequencies at the feedback input FB, or PLL IN, that fall within unity gain or amplification regions of the closed loop transfer function of PLL 144.

Referring now to FIGS. 1B and 3 together, processes 102 include a first process 103 that involves a first step of approximating incoming jitter to feedback input FB IN of PLL 144 by simulating noise arising from operation of circuitry on chip 101, where the simulation is responsive to a model of circuitry on device 101. In one embodiment of the invention, this simulates all active circuits, including circuitry 145, as well as memory devices, integrated processors, input/output buffers, and other logic functions, but excluding PLL 144. VDD noise and GND noise simulated by process 103 are illustrated in FIG. 2, according to an embodiment of the present invention.

Next, process 104 applies VDD and GND noise simulated by process 103 to the model of VDD and GND connections of buffers 146.1, 146.2, etc. in the model of clock tree 142, since buffers 146.1 and 146.2 are in the PLL's feedback path. Thus, the simulated operation of circuitry on chip 100 by process 104 includes clock tree 142, but with an idealized clock signal on PLL OUT. The noise simulated by process 104 is at an output leaf of clock tree 142 that will be fed back to PLL 144, which is shown in FIG. 3, for purposes of illustration, as output CLK_OUT_2 of the second buffer 146.2. (The number of buffers 146 in clock tree 142 varies. Two buffers are shown here merely as an example. Process 102 is applicable to any number of clock buffers . . . 146.1 through 146.n)

Figure 4:
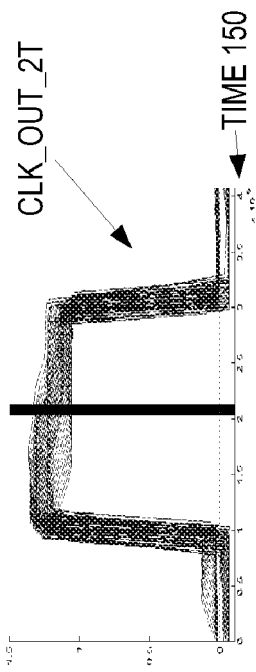
FIG. 4 illustrates a signal in both the time and frequency domains that is produced by simulated operation of circuitry on the device of FIG. 1A including the device's clock distribution network, according to an embodiment of the present invention.

Referring now to FIG. 4 with FIG. 1B, simulated feedback clock waveform CLK_OUT_2T, as generated by process 104, is shown in the time-domain 150. CLK_OUT_2T includes jitter due to VDD-GND noise generated by circuitry such as circuitry 145 (FIG. 3) of device 100 (FIG. 3).

Referring to FIG. 6 with FIG. 1B, process 105 next converts, by the application of the Laplace transform, the simulated feedback clock signal CLK_OUT_2T of process 104 from time domain 150 to CLK_OUT_2F in frequency domain 160. CLK_OUT_2F, includes a carrier frequency arising from the above mentioned, idealized, square wave clock signal. That is, CLK_OUT_2F has a fundamental frequency corresponding to the carrier frequency that is output by PLL 144, which is 246 MHZ according to the embodiment of the invention shown in FIG. 3.

Process 105 uses Eigenvalue decomposition to scale components of CLK_OUT_2F in the frequency domain responsive to time domain variations of the components at respective frequencies and then to remove components of CLK_OUT_2F. That is, the components removed are centered about the fundamental and odd harmonic frequencies of CLK_OUT_2F, where the frequency widths about the fundamental and odd harmonic frequencies within which components are removed depend upon on the time scaled magnitudes of the components. In particular, components tend to fall of in magnitude about a peak at the center of the previously mentioned fundamental and odd harmonic frequencies. In an embodiment of the invention, components are removed on either side of a fundamental or odd harmonic center frequency until a component is reached that has a magnitude below a certain predetermined percentage of the peak magnitude.

Figure 7:
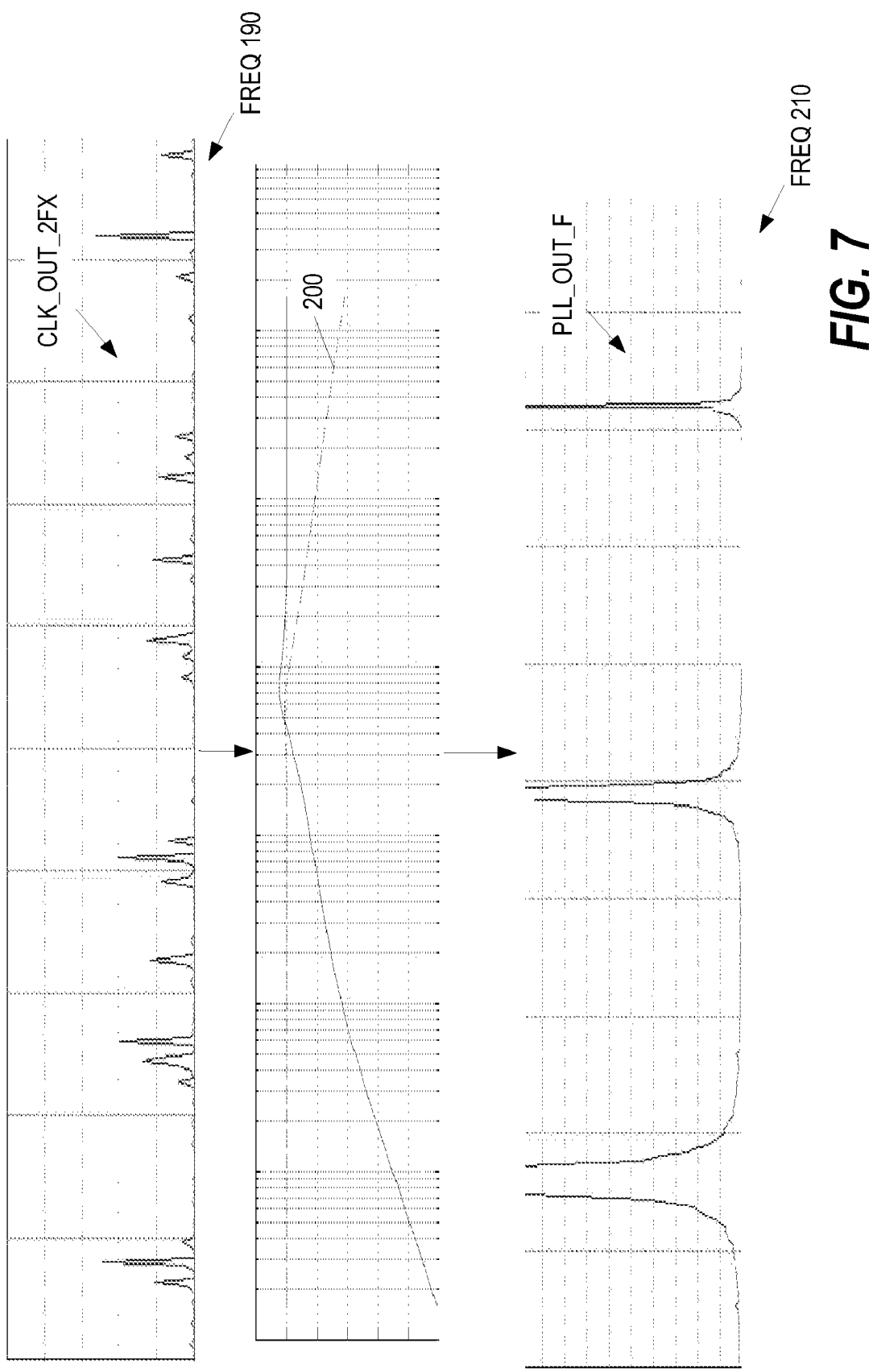
FIG. 7 illustrates the simulated CLK_OUT_2FX of FIG. 6 generated by removing the first five harmonics of the square wave components of the simulated CLK_OUT_2F signal, the PLL closed-loop transfer function, and the resulting PLL_OUT_F signal when the CLK_OUT_F signal is passed through the PLL's closed-loop transfer function.

This component removal process produces a simulation signal CLK_OUT_2FX shown in frequency domain 190 of FIG. 7. (The square-wave components are represented in frequency domain 190 by odd-harmonics starting at the carrier frequency. The amplitude of the harmonics is represented by the equation An=1/N*A1 where A1 is the first harmonic amplitude at the carrier frequency.) Having removed components centered about the carrier and its harmonics 1, 3, 5, 7 and 9, essentially the only remaining spectral components are the components of jitter of the feedback clock, i.e., an essentially noise-only signal CLK_OUT_2FX.

Next, process 106 applies the closed-loop transfer function 200 of PLL 144 (FIG. 3), to signal CLK_OUT_2FX, which is inputted to PLL 144 FB input (FIG. 3). This yields a simulated PLL OUT signal illustrated in FIG. 7 in the frequency domain 210, which is a PLL 144 (FIG. 3) non-idealized clock signal including jitter. That is, process 106 produces the PLL_OUT_F signal of FIG. 7 from the residue of the convolution of the noise signal CLK_OUT_2FX and the PLL closed-loop transfer function 200.

Figure 8:
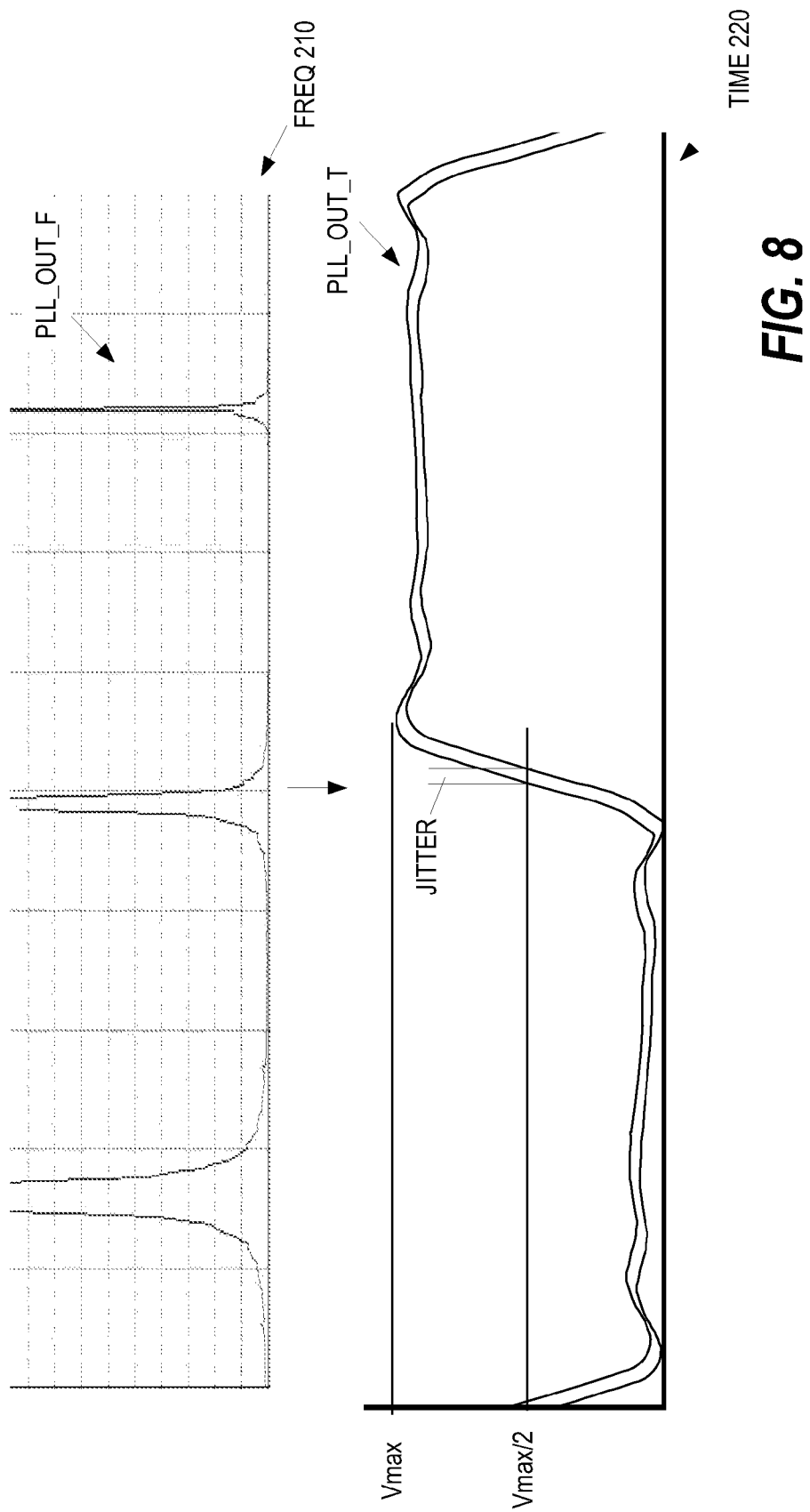
FIG. 8 illustrates PLL_OUT_F signal in the frequency domain and PLL_OUT_T signal in the time domain, after the signal of FIG. 7 is passed through the PLL closed-loop transfer function of FIG. 5 by processes 106 and 107, according to an embodiment of the present invention.

Next, process 107 applies the inverse Laplace transform to the PLL_OUT_F signal of FIG. 7 that was simulated by process 106. The PLL_OUT_T signal resulting from the inverse Laplace transform is shown in the FIG. 8 in time domain 220. Process 107 then determines the amount of jitter in PLL_OUT_T by measuring the width of the leading edge of the jittery PLL_OUT_T signal 220 at its 50% point, as shown in FIG. 8. That is, the voltage waveform shown in FIG. 8 has a range of approx. 0 to 1 volt. In this instance, the 50% point is 0.5 volt, i.e., midway between 0 and 1 volt. Thus, the "width" in this instance is the distance along the time axis, i.e., the time duration, at the 0.5 volt level. This time duration is called the amount of "jitter" in this case, because the time at which the illustrated signal will rise to the 0.5 volt level is indeterminate by this amount.

Processes 102 may also include process 108 comparing the PLL's output jitter to a predefined limit, and if the jitter exceeds the limits, passing control to process 109 which iteratively changes the design of device 101 or the process used to produce device 101. This may include changes to reduce the output jitter, or it may include changes to accommodate the jitter rather than reducing it. This may include selecting circuit structures or fabrication processes in order to change PLL 144 bandwidth, circuitry 145, clock distribution network 142, decoupling capacitors such as 149, or any other circuit in device 101, and may include fabricating device 101 according to those selected processes and including those selected structures.

Parameters which the user may select to change in order to modify the PLL 144 bandwidth include charge pump gain, VCO gain and frequency, loop filter component values, loop frequency dividers, and VDD supply voltage. Digital tuning bits can directly control these values, which will affect the PLL transfer function's peaking and bandwidth.

If the feedback clock jitter spectral components fall within the unity gain region (FIG. 5, 171), then a preferred method to mitigate high PLL output jitter is to reduce the feedback clock jitter such as by reducing the clock tree length, adding decoupling capacitors to reduce noise, or relocating the clock tree and/or the PLL. If the feedback clock spectral components fall within the amplification region (FIG. 5. 172), then additional steps may also be required, such as changing the PLL's transfer function through tuning bits or application conditions. If the feedback clock spectral components fall within the attenuation region (FIG. 5, 173), then it is unlikely that mitigation is required. However, the same actions may be taken as just described for the unity gain and application regions.

Other Variations and General Remarks

The description of the present embodiment has been presented for purposes of illustration, but is not intended to be exhaustive or to limit the invention to the form disclosed. Many modifications and variations will be apparent to those of ordinary skill in the art. For example, Eigendecomposition can be used to isolate individual signal components based on signal strength. One advantage of Eigendecomposition is the isolation of secondary signal components containing very little power. Such secondary components may not be visible in Fourier spectra because of spectral leakage and resolution considerations. The first Eigenmode will capture the predominant data trend in the signal, the second next predominant, and so forth. It does not matter if the component captured is sinusoidal, a square wave, a sawtooth, or a harmonic pattern. Further, the signal may be a slowly varying low frequency harmonic oscillation, or a high frequency sinusoid. The Eigenmodes are said to be adaptive, because they capture components in an Eigenvalue-ordered sequence. With Eigendecomposition, it is possible to isolate backgrounds by reconstructing only the noise Eigenmodes.

The terms "circuitry" and "memory," and the like are used herein. It should be understood that these terms refer to circuitry that is part of the design for an integrated circuit chip such as device 101 of FIG. 1C. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

Unless clearly and explicitly stated, the claims that follow are not intended to imply any particular sequence of actions. The inclusion of labels, such as a), b), c) etc., for portions of the claims does not, by itself, imply any particular sequence, but rather is merely to facilitate reference to the portions.

What is claimed is:

1. A method for designing integrated circuitry ("IC"), the method comprising:
    simulating noise of modeled IC operation, wherein the simulating includes simulating by a computer system and excludes certain clock circuitry of the IC;
    applying the simulated noise by the computer system to buffers of a clock tree of the modeled IC and responsively generating a first simulated clock tree output signal;
    scaling, by the computer system, components of the first simulated clock tree output signal in a frequency domain responsive to time domain variations of the components at respective frequencies;
    generating, by the computer system, a simulated, substantially noise-only, clock tree output signal in a frequency domain, including removing ones of the components responsive to i) at least one clock signal frequency of the certain clock circuitry and ii) magnitudes of the time variation scaled components;
    generating, by the computer system, a second simulated clock circuitry output signal responsive to applying a closed loop transfer function of the certain clock circuitry to a simulated reference clock signal and the substantially noise-only clock tree output signal; and
    selecting a circuit structure or a fabricating process for the IC responsive to jitter of the transformed second simulated clock circuitry output signal.

2. The method of claim 1, comprising:
    transforming the second simulated clock circuitry output signal to a time domain signal by an inverse Laplace transformation.

3. The method of claim 1, wherein the scaling includes Eigenvalue decomposition of the first simulated clock tree output signal.

4. The method of claim 1, wherein removing components from the converted clock tree output signal comprises:
    removing the components responsive to a fundamental frequency and odd harmonic frequencies of the clock signal.

5. The method of claim 1, wherein applying the simulated noise to the buffers comprises:
    applying the simulated noise to voltage supply and ground connections of the buffers.

6. The method of claim 1, wherein generating a first simulated clock tree output signal comprises:
    generating the first simulated clock tree output signal at a certain output node of the clock tree, wherein the clock tree has a number of sets of buffers connected in series, at least one of the sets has a maximum number of such series-connected buffers, and one of the series-connected sets of buffers is from an input node receiving the reference clock signal to the certain clock tree output node and is among the at least one of the sets having a maximum number of such series-connected buffers.

7. The method of claim 1, wherein the simulating that excludes certain clock circuitry of the modeled IC excludes phased locked loop ("PLL") circuitry.

8. The method of claim 7, comprising:
    feeding the first simulated clock tree output signal back to a node of the certain clock circuitry;
    wherein feeding the first simulated clock tree output signal back comprises:
        feeding the first simulated clock tree output signal back to a node of the PLL circuitry.

9. The method of claim 1 further comprising:
    simulating a clock signal from an idealization of the excluded clock circuitry without regard to actual circuitry layout of the excluded clock circuitry; and
    wherein the simulating noise of modeled IC operation includes:
        simulating noise effects of IC logic circuitry operation; and
    wherein the generating of the first simulated clock tree output signal is further in response to the clock signal simulated from the idealization of the excluded clock circuitry.

10. A computer program product, stored on a tangible, computer readable medium, for designing integrated circuitry ("IC"), said computer program product having instructions for execution by a computer, which, when executed by the computer, cause the computer to implement a method comprising steps of:
    simulating noise of modeled IC operation, wherein the simulating excludes certain clock circuitry of the IC;
    applying the simulated noise to buffers of a clock tree of the modeled IC and responsively generating a first simulated clock tree output signal;
    scaling components of the first simulated clock tree output signal in a frequency domain responsive to time domain variations of the components at respective frequencies;
    generating a simulated, substantially noise-only, clock tree output signal in a frequency domain, including removing ones of the components responsive to i) at least one clock signal frequency of the certain clock circuitry and ii) magnitudes of the time variation scaled components;
    generating a second simulated clock circuitry output signal responsive to a closed loop transfer function of the certain clock circuitry applied to a simulated reference clock signal and the substantially noise-only clock tree output signal; and
    selecting a circuit structure or a fabricating process for the IC responsive to jitter of the transformed second simulated clock circuitry output signal.

11. The computer program product of claim 10, wherein the method steps further comprise:
    transforming the second simulated clock circuitry output signal to a time domain signal by an inverse Laplace transformation.

12. The computer program product of claim 10, wherein the scaling includes Eigenvalue decomposition of the first simulated clock tree output signal.

13. The computer program product of claim 10, wherein removing components from the converted clock tree output signal comprises:
    removing the components responsive to a fundamental frequency and odd harmonic frequencies of the clock signal.

14. The computer program product of claim 10, wherein the simulating that excludes certain clock circuitry of the modeled IC excludes phased locked loop ("PLL") circuitry.

15. The computer program product of claim 10, said computer program product having further instructions for execution by the computer, which, when executed by the computer, cause the computer to implement a method further comprising:
    simulating a clock signal from an idealization of the excluded clock circuitry without regard to actual circuitry layout of the excluded clock circuitry; and
    wherein the simulating noise of modeled IC operation includes:

simulating noise effects of IC logic circuitry operation; and wherein the generating of the first simulated clock tree output signal is further in response to the clock signal simulated from the idealization of the excluded clock circuitry.

16. A computer system comprising:

a processor; and a storage device connected to the processor, wherein the storage device has stored thereon an integrated circuitry ("IC") design program for controlling the processor, and wherein the processor is operative with the program to execute the program for performing method steps of:

simulating noise of modeled IC operation, wherein the simulating excludes certain clock circuitry of the IC;

applying the simulated noise to buffers of a clock tree of the modeled IC and responsively generating a first simulated clock tree output signal;

scaling components of the first simulated clock tree output signal in a frequency domain responsive to time domain variations of the components at respective frequencies;

generating a simulated, substantially noise-only, clock tree output signal in a frequency domain, including removing ones of the components responsive to i) at least one clock signal frequency of the certain clock circuitry and ii) magnitudes of the time variation scaled components;

generating a second simulated clock circuitry output signal responsive to a closed loop transfer function of the certain clock circuitry applied to a simulated reference clock signal and the substantially noise-only clock tree output signal; and selecting a circuit structure or a fabricating process for the IC responsive to jitter of the transformed second simulated clock circuitry output signal.

17. The computer system of claim 16, wherein the method steps further comprise:

transforming the second simulated clock circuitry output signal to a time domain signal by an inverse Laplace transformation.

18. The computer system of claim 16, wherein the scaling includes Eigenvalue decomposition of the first simulated clock tree output signal.

19. The computer system of claim 16, wherein removing components from the converted clock tree output signal comprises:

removing the components responsive to a fundamental frequency and odd harmonic frequencies of the clock signal.

20. The system of claim 16, wherein the processor is operative with the program to execute the program for performing a further method step comprising:

simulating a clock signal from an idealization of the excluded clock circuitry without regard to actual circuitry layout of the excluded clock circuitry; and wherein the simulating noise of modeled IC operation includes:

simulating noise effects of IC logic circuitry operation; and wherein the generating of the first simulated clock tree output signal is further in response to the clock signal simulated from the idealization of the excluded clock circuitry.

* * * * *